United States Patent [19]
Webb et al.

[11] Patent Number: 5,516,705
[45] Date of Patent: May 14, 1996

[54] METHOD OF FORMING FOUR LAYER OVERVOLTAGE PROTECTION DEVICE

[75] Inventors: Monty F. Webb, Richardson; Elmer L. Turner, Irving, both of Tex.

[73] Assignee: Teccor Electronics, Irving, Tex.

[21] Appl. No.: 449,813

[22] Filed: May 24, 1995

Related U.S. Application Data

[62] Division of Ser. No. 119,812, Sep. 10, 1993.

[51] Int. Cl.⁶ ..................................... H01L 49/00
[52] U.S. Cl. ............................ 437/6; 437/31; 437/170; 437/904
[58] Field of Search ............................ 437/6, 904, 956, 437/969, 170, 31; 148/DIG. 13, DIG. 126

[56] References Cited

U.S. PATENT DOCUMENTS

| | | | |
|---|---|---|---|
| 3,152,928 | 10/1964 | Hubner | 148/33 |
| 3,196,330 | 7/1965 | Moyson | 257/121 |
| 3,210,571 | 10/1965 | Hutson | 327/461 |
| 3,236,698 | 2/1966 | Shockley | 148/33 |
| 3,246,172 | 4/1966 | Sanford | 327/438 |
| 3,275,909 | 9/1966 | Gutzwiller | 257/119 |
| 3,284,680 | 11/1966 | Gentry et al. | 257/176 |
| 3,391,310 | 7/1968 | Gentry | 257/128 |
| 3,423,650 | 1/1969 | Cohen | 257/544 |
| 3,535,615 | 10/1970 | Howell et al. | 323/240 |
| 3,681,667 | 8/1972 | Kokosa | 257/123 |
| 3,746,887 | 7/1973 | Lorenz | 327/455 |
| 3,907,615 | 9/1975 | Weijland | 437/6 |
| 3,961,354 | 6/1976 | Kuwagata et al. | 257/129 |
| 3,967,308 | 6/1976 | Yatsuo et al. | 257/123 |
| 3,970,843 | 7/1976 | Dumas | 250/211 J |
| 4,071,852 | 1/1978 | Kannam | 257/497 |
| 4,089,024 | 5/1978 | Tanaka | 257/126 |
| 4,157,562 | 6/1979 | D'Altroy et al. | 257/128 |
| 4,224,634 | 9/1980 | Svedberg | 257/115 |
| 4,275,408 | 6/1981 | Yukimoto | 257/136 |
| 4,298,881 | 11/1981 | Sakurada et al. | 257/129 |
| 4,509,089 | 4/1985 | Svedberg | 361/160 |
| 4,574,296 | 3/1986 | Sueoka et al. | 257/153 |
| 4,797,720 | 1/1989 | Lindner et al. | 257/110 |
| 4,827,497 | 5/1989 | Norris et al. | 327/26 |
| 4,914,045 | 4/1990 | Webb et al. | 437/6 |
| 4,967,256 | 10/1990 | Pathak et al. | 257/112 |
| 5,001,537 | 3/1991 | Colman et al. | 257/173 |
| 5,065,211 | 11/1991 | Voss | 257/164 |
| 5,150,271 | 9/1992 | Unterweger et al. | 361/119 |

FOREIGN PATENT DOCUMENTS 2113907A 8/1983 United Kingdom.

*Primary Examiner*—Olik Chaudhuri
*Assistant Examiner*—H. Jey Tsai
*Attorney, Agent, or Firm*—Richards, Medlock & Andrews

[57] ABSTRACT

An overvoltage protection device having multiple shorting dots in the emitter region and multiple buried regions substantially aligned with these shorting dots. The placement, number, and area of these buried regions reduce and more accurately set the overshoot voltage value of the device while maintaining the high surge capacities of the device. Further, doping types and concentrations have been modified from that known in the prior art to reduce overshoot providing a more accurate and sensitive overvoltage protection device than that known previously in the prior art.

33 Claims, 2 Drawing Sheets

METHOD OF FORMING FOUR LAYER OVERVOLTAGE PROTECTION DEVICE

CROSS REFERENCE TO RELATED APPLICATIONS

This is a division of U.S. Patent Application Ser. No. 08/119,812 filed Sep. 10, 1993.

TECHNICAL FIELD OF THE INVENTION

This invention relates to semiconductor devices, and more particularly to multiple layer semiconductor switching devices for overvoltage surge protection.

BACKGROUND OF THE INVENTION

High voltage transients, often called voltage surges, may occur on transmission lines due to lightning strikes, power line switching or other unanticipated events. These voltage surges may cause damage to expensive communication equipment connected to the transmission lines, such as telephones, facsimile machines, or modems.

Overvoltage protection devices have been developed to protect expensive communication equipment from these voltage surges. Such overvoltage protection devices will protect this equipment by diverting the voltage surges away from the transmission line before it has an opportunity to damage the communication equipment. Typically, overvoltage protectors remain in a substantially non-conducting state until a voltage surge occurs on the transmission line. When a voltage surge occurs on the transmission line, the overvoltage protectors will activate into a conducting state thereby diverting the voltage surge away from the transmission line and the telephone equipment.

Conventional overvoltage protection devices include zener diodes, gas discharge tubes and metal oxide varistors ("MOVs"). Zener diodes operate using a voltage breakover point, but they are not suitable for transient suppression because of DC power dissipation and relatively low thermal capacitance. MOVs and gas discharge tubes may not have adequate response capabilities to provide effective protection for fast rising voltage surges. MOVs degrade with operation and gas discharge tubes degrade over time. Such degradations ultimately lead to a loss of protection capabilities.

The thyristor family of semiconductor devices solves many of the problems associated with conventional overvoltage devices. The thyristor family of semiconductor devices consists of several very useful devices, including silicon control rectifiers ("SCRs"), triacs and sidacs. Thyristors are characterized as having two states, an ON state and an OFF state. In the OFF state, the device has high impedance and low current characteristics. In the ON state, the semiconductor device has low resistance and high current characteristics. Some thyristors activate into an ON state by the application of a gating current on the device. Other thyristors automatically activate into an ON state without gating if a large overvoltage surge is placed across the terminals of the device. The thyristor, like conventional overvoltage protectors, is normally in an OFF state allowing only a small leakage current to pass through the device. The thyristor is connected to transmission lines in such a manner as to activate into an ON state when a large overvoltage surge is detected thereby conducting the voltage surge away from communication equipment.

An SCR device is a unidirectional semiconductor device having an anode, a cathode and a gate. In the OFF state, an SCR is a high resistance, low current circuit element. If a momentary positive pulse is applied to the gate of an SCR under the proper voltage conditions, the device will switch to the ON state and become a low resistance, high current element. Once an SCR is activated into the ON state, it will remain in the ON state until the principal anode to cathode current drops below a holding current of the device.

A triac is a bidirectional thyristor which controls power in an AC electric circuit. The operation of a triac can be related to two SCRs connected in an inverse parallel circuit configuration. A triac has a single gate, and the device can be triggered to the ON state by a gate pulse of either positive or negative polarity. In normal operation when a voltage is applied across the top and bottom contacts of the triac, the semiconductor blocks current flow, except for a small leakage current. When a gate current is applied to the single gate of the triac under the proper voltage conditions, the device is triggered into the ON state. The triac will remain in the ON state, even after the gate voltage is removed, until the current drops below a sustaining current, called a holding current ($I_H$). A triac is bidirectional thereby allowing current flow in either direction.

A sidac has the same low voltage, low current triggering characteristics and high holding characteristics as a triac. The sidac is designed to provide fabrication and installation cost savings by combining several circuit elements into a single two terminal device which functions effectively in an overvoltage protection system. The sidac also eliminates the need for a third contact or gate. Switching of the sidac occurs in the absence of a gate signal when a large voltage potential, in excess of the breakover voltage, is applied across the terminals of the device. This switching phenomenon is commonly known as breakover and the potential at which it normally occurs is known as the breakover voltage.

Semiconductor thyristor devices are characterized generally as having four layers of alternating conductivity, i.e., NPNP or PNPN. The four layers in the sidac device include an emitter layer, an upper base layer, a mid-region layer and a lower base layer, respectively. The emitter region is sometimes referred to as a cathode region, while the lower base layer is sometimes referred to as an anode region. The two metal terminals of the sidac device are coupled to the emitter and lower base regions of the device, respectively.

As the voltage across the device increases, the electric field across the center junction of the device (the upper base layer/mid region layer), reaches a value sufficient to cause avalanche multiplication. After avalanche multiplication occurs, the impedance of the device decreases substantially and the voltage across the device reduces from a maximum voltage value (which is determined by the avalanche voltage of the center junction) to a much lower voltage value. Of course, the current flow through the device will increase proportionally as the voltage across the terminal decreases. The device will remain in this low impedance condition until the current across the device is reduced below a holding current value.

The device switches from an OFF to an ON state when its current gain exceeds unity. The well known method of switching the device from an OFF to an ON state is to increase the voltage across the device terminals until the center junction thereof breaks down or avalanches. In the avalanche condition, the current increases rapidly thereby exceeding the unity value for current gain.

Another method of switching the device from an OFF to an ON state is to apply a signal voltage which is relatively steep, namely, which has a "rate of rise" greater than a predetermined value. "Rate of rise" is often calculated using the function dV/dt, a derivative function of change in voltage over change in time. At equilibrium, the junctions in the device have a space charge region which acts as a built-in capacitor. The charge on this capacitor is related to an applied voltage as follows:

$$Q = C\,V$$

As the voltage between the terminals of the device increases, the time rate of change of charge, or current density, also increases. Assuming the capacitance remains constant, the equation for current density, J, is as follows:

$$J = C\,dV/dt$$

In this equation, C represents the junction capacitance, V represents the applied voltage and J represents the current density (time rate of change of the charge Q). For a fast rising voltage, the value of J can be substantial. If the "rate of rise", dV/dt of the applied voltage to the device is sufficient, the alpha or current gain of the device will exceed unity. Thus, the device may switch to an ON state if the "rate of rise" applied to the device is sufficiently large.

It has been found that if the switching voltage is approached slowly, the device will turn ON at only one point of the junction. This point corresponds to the junction's lowest voltage breakover voltage. In this situation, the uniform activation of the device will likely be achieved at, or near, the desired breakover voltage.

If, however, a switching voltage is applied to the device with a fast rising voltage pulse having a high "rate of rise", the device will activate at an overshoot voltage significantly above the breakover voltage. In the overshoot voltage situation, the device will not activate at, or near, the desired voltage. The voltage overshoot of the device may significantly affect the amount of voltage allowed to build up before the device turns ON. Such voltage overshoots should be minimized so that any voltage over the breakover voltage of the device does not reach the communication equipment.

Apart from overshoots caused by a high "rate of rise," other differences between the actual breakover voltage and the desired breakover voltages may be caused by inhomogeneities produced by small localized areas or defects. These localized regions may be caused by statistical variations in the concentration of impurities added to a layer in the semiconductor device. Other defects affecting the breakover voltage may be caused by dislocations; metal precipitates such as iron, copper or manganese; oxygen or silicon oxide precipitates within the device; nonuniform doping which may occur during the diffusion process; surface conditions during device fabrication; or, a combination of these factors.

Typically, when the device initially is switched ON, only part of the avalanching junction will be conducting. The remainder of the junction will be brought into full conduction by a spreading of the conducting plasma across that junction. This spreading of conducting plasma corresponds to the spreading of the voltage drop laterally across the junction of the device. The time for the entire junction to be fully activated to the ON state is called the spreading time and the speed of the plasma spreading is called the spreading velocity.

In thyristors, the spreading time is of considerable interest since it has an important effect on the dynamic behavior of the device. The switching speed of the device is directly proportional to the spreading speed of the conducting plasma. Depending on the size of the device, it may take up to several hundred microseconds for the spreading to be completed. During the spreading phase, the voltage across the device is much greater than it is when the thyristor is fully activated across the junction. The spreading velocity should be maximized to minimize the spreading time. A shorter spreading time should minimize the voltage build up in the device prior to activation. Further, spreading velocities should be maximized to minimize the time necessary to activate the device during very high surge concentrations.

The presence of hot spots and defects reduces the switching speed of the device by producing avalanching at specific locations on the device junction while not avalanching at other locations on the junction. These defects and hot spots hinder the spreading of the conducting plasma. Further, these hot spots and other defects will initially carry most of the current and continue to carry this current until the voltage drop spreads laterally across the remainder of the junction. These defects produce excessive local current densities and ultimately burnout of the device. The device may not fully activate into an ON state due to these localized hot spots; which, in turn may cause the overshoot voltage to increase substantially over the desired breakover voltage. Additionally, these localized defects may significantly affect the spreading velocity and substantially decrease surge capabilities.

One technique used to compensate for the presence of defects and the formation of hot spots is to attempt to more uniformly distribute the avalanche phenomenon across the junction of the device. The principle of this solution is to make the switching mechanism a distributed phenomenon instead of a point phenomenon. In such a manner, when the device switches and the current flows across the junction, it is less likely to create localized hot spots at a single point of avalanching. Thus, the longevity and accuracy of the device will be increased if the avalanche charge spreads as quickly as possible across the entire junction of the device.

Thermally generated leakage current has also been known to significantly affect the breakover voltage accuracy and activation sensitivity of the devices. In addition to thermally generated or bulk leakage current effects, leakage currents across exposed surface junctions, even when protected by conventional means, have serious effects on activation sensitivity since those currents are generated in a very large magnitude. This is especially true for the large leakage currents across the blocking junction of a thyristor.

One method of distributing the breakover phenomenon across a greater portion of the junction includes the use of a buried region within a multi-layered device. The buried region directs the current through the middle of the device away from the surface, hot spots, or point defects. In this manner, a buried region decreases the leakage current on the exposed surfaces of the device, decreases the detrimental effects of hot spots and impurities within the device and increases the accuracy of the device. A single buried region, however, creates bottlenecking of the current flow through the device. This bottlenecking can substantially decrease the current carrying capacity of the device.

Another improvement in the switching characteristics of thyristor devices has been developed by the use of shorting dots in the emitter region. These shorting dots are regions in the upper base layer of the device which are contiguous to the upper metal contact. The shorting dot regions affect the sensitivity of the device and improve the accuracy of the gating characteristics as a function of temperature. Shorting dot regions improve gating characteristics by shunting out thermally generated leakage current thereby reducing the activation sensitivity of the device.

The use of a single buried region in the mid-region layer of starting silicon is disclosed in British Patent No. GB 2113907 and U.S. Pat. No. 4,967,256. The use of shorting dots in the emitter region is also disclosed in U.S. Pat. No. 4,967,256. The device disclosed in U.S. Pat. No. 4,967,256 possesses substantial bottlenecking problems and restrictions on current flow after the device is placed in a conductive state.

The use of multiple buried regions within the mid-region layer and the use of shorting dots in the emitter region is disclosed in U.S. Pat. No. 5,001,537. In U.S. Pat. No. 5,001,537, the buried region is split into a number of small areas which "should be aligned with the part of the cathode between the shorting dots." Col. 2, lines 17–19. U.S. Pat. No. 5,001,537 discloses that the principle of the invention is to break up the buried layer into an array of buried regions directly under the emitter regions (sometimes called the cathode regions). Col. 3, lines 35–38. While this arrangement may prevent some of the problems associated with bottlenecking of the current, it aligns the buried regions and the emitter regions with "dead areas" of the device. These "dead areas" often exist in the upper base layer under the emitter region or above the buried regions as a result of the higher doping required to make the buried region. This alignment of the buried region with the emitter region, therefore, causes substantial problems due to the dead areas of the device.

U.S. Pat. No. 5,001,537 discloses that the overshoot voltage for the device is "typically only 70 volts for a 90 volt device." Col. 3, line 66. This relates to a significantly high overshoot voltage value of approximately 80% over the desired breakover voltage rating. Such a high voltage overshoot could cause substantial damage to electrical equipment connected thereto by allowing voltages up to 160 V access to communication equipment. This high overshoot voltage value also restricts this device for use only as a primary protector in protection circuit configurations (typically in applications where a gas discharge tube is used).

It would therefore be advantageous to have a more sensitive and accurate solid state overvoltage protection device with lower overshoot voltage value. Further, this device should possess high surge capacity and possess a current path which substantially avoids the "dead areas" in the device. Ideally, such a device would retain a high spreading velocity and other advantages of devices currently known in the prior art.

SUMMARY OF THE INVENTION

The present invention reduces the overshoot voltage value substantially providing a more sensitive and accurate solid state overvoltage protection device. The present invention uses multiple buried regions within the mid-region layer and shorting dots in the emitter region. This invention, however, substantially aligns the buried regions with the shorting dots to decrease the overshoot voltage value and increase surge capacities of the device. Further, the size and shape of the buried regions are varied to prevent bottlenecking of the current flow through the device. The placement and area of the buried regions in the mid-region layer increases the spreading velocity across the junction and decreases the overshoot voltage value. This invention significantly lowers the overshoot voltage value and increases surge capacities of the device while retaining all the benefits of high spreading velocity, avoidance of surface currents, and decreased hot spot effects.

Further, this invention may use a deposition of highly doped N-type dopant in the lower base region opposite the emitter region. This highly doped N-type region acts as a "getter" region insuring low leakage current and a lower avalanche voltage of the device. This "getter" region also provides for a greater concentration of electrons flowing across the mid-region layer to aid in activation of the device.

BRIEF DESCRIPTION OF THE DRAWINGS

For better understanding of the nature of the present invention, reference should be made to the following Detailed Description and Drawings in which.

DETAILED DESCRIPTION

Figure 1:
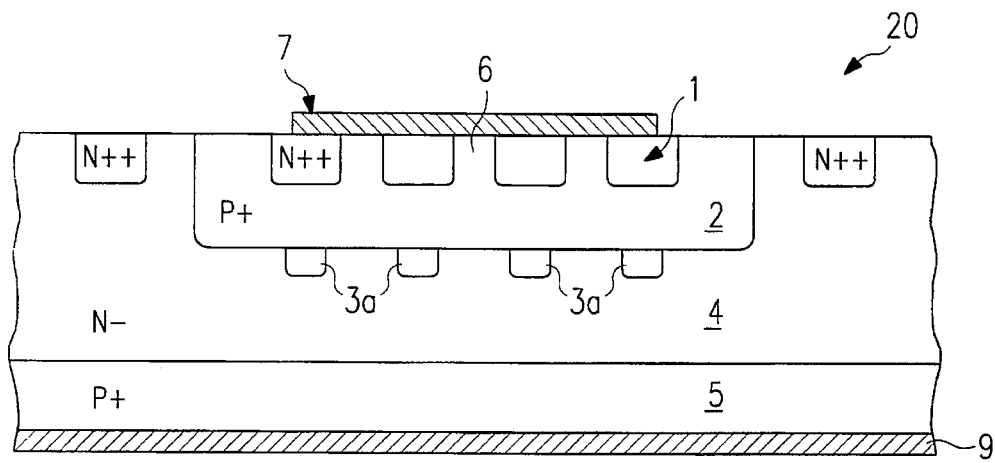
FIG. 1 is a cross sectional view of the overvoltage protection device disclosed in the prior art.

FIG. 1 discloses a prior art embodiment 20 including metal contact regions 7 and 9, emitter region 1, multiple shorting dot regions 6 and multiple buried regions 3a in the mid-region layer 4. This configuration restricts the buried regions 3a placement such that they are only under the emitter regions 1. This configuration partially compensates for defective junction conditions, such as hot spot areas. Dead areas often exist in the midregion layer 4 under the emitter region 1 or above the buried regions 3a due to the higher doping level needed to form the buried region. There are substantial disadvantages associated with aligning the emitter regions 1 vertically with the multiple buried regions 3a because of the existence of these "dead" areas. This configuration results in a high overshoot voltage values and low surge capabilities due to this placement of the buried regions 3a and the disadvantages associated with the emitter region 1 vertically aligned with the buried regions 3a over the dead areas created by the buried regions.

Figure 2:
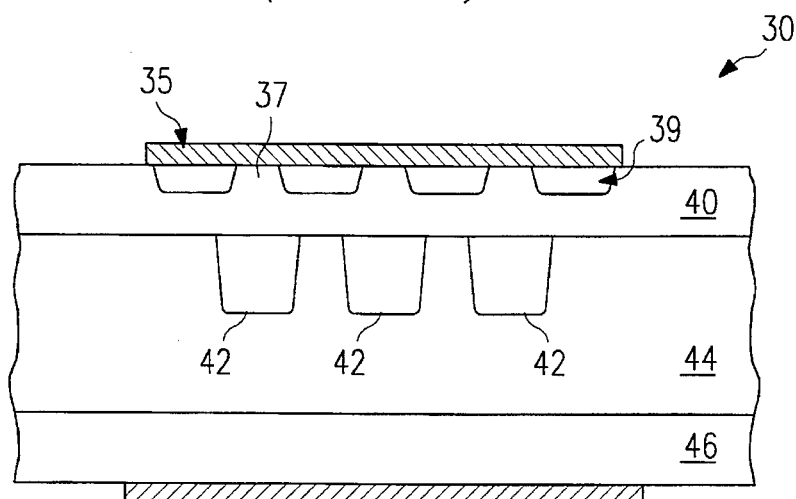
FIG. 2 is a cross sectional view of the present invention possessing shorting dots in the emitter region and multiple buried regions thereunder.

FIG. 2 discloses a cross section of the present invention 30 in which the device possesses metal contacts 35 and 48. The upper base region 40 possesses emitter region 39 separated by shorting dots 37. The upper base 40 is $N^+$-type conductivity while the emitter regions are $P^{++}$-type conductivity. The shorting dots 37 are $N^+$-type conductivity like the upper base region 40.

The emitter region 39 and the shorting dots 37 are coupled to the metal junction 35. The mid-region layer 44 possesses buried regions 42 substantially aligned with the shorting dots 37. The mid-region layer is P-type conductivity, while the buried regions are $P^+$-type conductivity. The concentration range for the mid-region layer may be $P^-$ to P, while the concentration range for the buried regions may be P to $P^+$ type conductivity. The lower base region 46 is placed beneath the mid-region layer 44 and in contact with the metal contact 48. The lower base region is $N^+$-type conductivity.

The P-type dopants add positive charges to the semiconductor material, while the N-type dopants add negative charges to the semiconductor materials. Preferably, the $P^{++}$ or $N^{++}$ concentration approximately encompasses the range of $1 \times 10^{19}$ to $1 \times 10^{21}$ atoms/cm$^3$ and the $P^+$ and $N^+$ concentration approximately encompasses the range of $1 \times 10^{15}$ to $1 \times 10^{20}$ atoms/cm$^3$. The $P^-$ to P (or $N^-$ to N) range of dopant concentration approximately encompasses the range of $1 \times 10^{14}$ to $1 \times 10^{16}$ atoms/cm$^3$. The concentration in the regions may vary depending on what depth of the region is examined. Thus, these concentrations are provided only in approximate ranges.

The placement of the buried regions substantially aligned with the shorting dots eliminates the dead areas in region 40 thereby increasing the spreading velocity and more accurately providing for a breakover voltage in addition to allowing for greater surge capacities for the device. As such, the placement of the buried regions 42 substantially aligned with the shorting dot regions 37 has lowered the overshoot voltage value of the device to about one quarter of the overshoot voltage values in the prior art. This decrease in overshoot voltage is substantial and provides a more sensitive device than that known in the prior art. Further, this device could be used as a primary or secondary type protector in the protection circuit configuration.

Substantial alignment includes vertical alignment of the buried region under the shorting dot region. The buried region is preferably wide enough to cover the entire area vertically underneath the shorting dot area. That is, it is preferable that the entire area vertically underneath the shorting dot area be covered by the buried region surface area on the junction. Further, the buried region may extend laterally on the junction to cover areas under both the shorting dot regions and some of the emitter regions. Typically, the diameter of the shorting dot is 3 mils. and the buried region may extend another 2.5 mils. laterally outside the end of the shorting dot regions under the emitter regions.

It is possible, however, that less than all of the area under the shorting dot region would be covered by the buried region surface area on the junction of the device. Any amount of surface area under the shorting dot region will improve performance significantly over the prior art performance due to a current path avoidance of "dead areas." Thus, substantial alignment of the buried region surface area under the shorting dot may include any amount of buried region surface area under the shorting dot region because any placement of the buried region under the shorting dot region has been found to be advantageous in providing an accurate overvoltage protection device with low overshoot voltage values and high surge capacities. Practically, the buried region surface area under the shorting dot could include 1% or more, up to, and including 100% of the area vertically underneath the shorting dot. Substantial alignment of the buried region under the shorting dot may include placement of the buried region under the emitter region as well. Thus, substantial alignment may include some overlap of the buried region under both the shorting dot and the emitter region as long as there is any substantial alignment of the buried region under the shorting dot region.

The use of a P-type mid-region layer 44, as opposed to the N-type conductivity mid-region layer disclosed in the prior art, has also proven to be beneficial in providing a more accurate breakover voltage of the device. Further, the accuracy of the device is dependent upon the area and depth of the buried regions 42 substantially aligned with the shorting dots. The buried regions 42 are approximately three times deeper than the depth of the upper base regions 40. Preferably, the total surface area covered by the buried regions on the junction between the upper base layer and the mid-region layer should be 30% of the area under the emitter region. Further, the preferable number of buried regions is 8. These are preferable surface areas and numbers of regions. Ranges may include greater or less percent surface areas of coverage or numbers of buried regions. The practical limitations on these ranges includes the space limitations of the device junction and the requirement that there exist sufficient spacing between the buried regions to avoid diffusion of these buried regions together. Considering these practical limitations, ranges may include 12–80% surface area coverage by the buried regions under the emitter and 6 to 10 buried regions.

Figure 3:
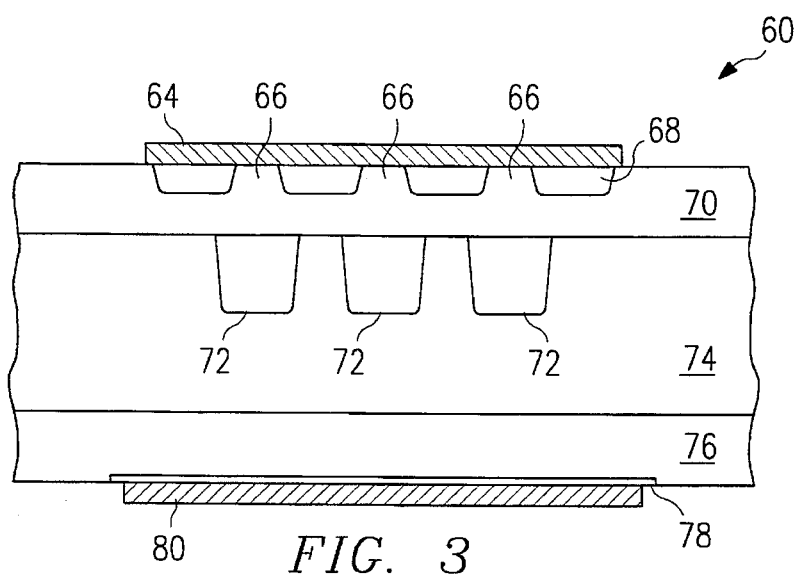
FIG. 3 is a cross sectional view of the present invention including shorting dots in the emitter region, multiple buried regions thereunder and a highly doped "getter" region.

In FIG. 3 the present invention 60 is shown with corresponding regions as shown in FIG. 2, except for an additional "getter" region 78. The metal contacts 64 and 80 are on the top and bottom of the structure 60. The upper base region 70 possesses multiple shorting dot regions 66 and emitter region 68. The mid-region layer 74 possesses multiple buried regions 72. As with FIG. 2, the multiple buried regions are substantially aligned with the shorting dot regions 66. The lower base region 76 is placed under the mid region layer 74 and the lower base region 76 possesses a "getter" region 78.

The "getter" region 78 is a highly doped region of the same type conductivity as lower base 76 and in contiguous placement to the lower metal contact 80. Preferably, the "getter" region uses a phosphorous dopant in the case of a P-type starting silicon. The "getter" region 78 is applied to the opposite side of the device as the emitter regions. "Getter" regions are also implanted above the shorting dot regions 66 in the emitter region 70. The "getter" region insures for a low leakage current. The concentration and dopant conductivity of the device is otherwise similar to the dopant concentration and conductivity type shown in FIG. 2.

The benefits disclosed in the FIG. 2 embodiment are likewise obtained in this circuit configuration. This "getter" region lowers the voltage necessary to turn the device on by providing a greater concentration of electron flow across the mid-region of the device. The "getter" region increases current flow, increases the efficiency of the device, and provides a more accurate turn-on for the device. Further, the "getter" region captures impurities in the implant area of the device and lowers leakage current.

Figure 4:
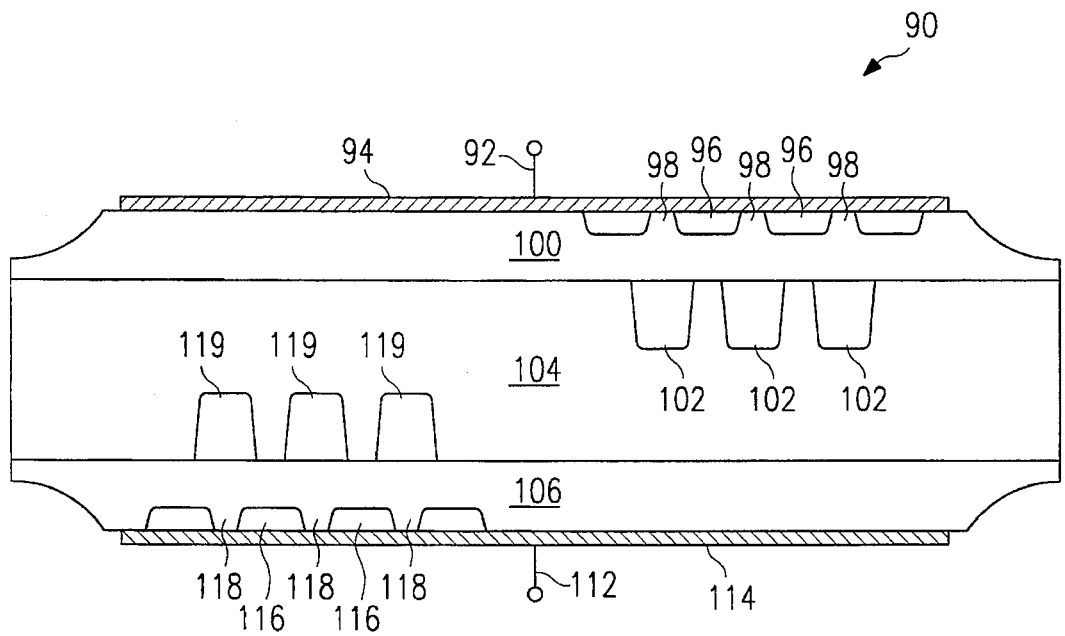
FIG. 4 is a cross sectional view of a bidirectional device possessing two circuit configurations of the present invention disclosed in FIG. 2 in an opposing bidirectional circuit configuration.

FIG. 4 discloses a bidirectional device 90 having two metal contacts 94 and 114. Contact 94 is connected to terminal 92 and contact 114 is connected to terminal 112. The structure 90 possesses two four-layer devices having a bidirectional current flow. On the right side of the circuit configuration 90, the device possesses an upper base region 100, a mid-region layer 104 and a lower base region 106. The left hand of device 90 has a current flow in the opposite direction to that of the right side of the device. The circuit configuration on the left side of the device has an upper base region of 106, a mid-region layer 104 and a lower base region of 100. The bidirectional configuration allows for either positive or negative polarity overvoltage protection from a single device. The device is fabricated using substantially the same conductivity types and concentrations as that disclosed in FIG. 2.

With respect to the left hand circuit of device 90, the upper base region 106 is shown possessing emitter region 116 and shorting dots 118 coupled to the lower metal contact 114. The mid-region layer 104 possesses multiple buried regions 119 substantially aligned with the shorting dots 118.

Figure 5:
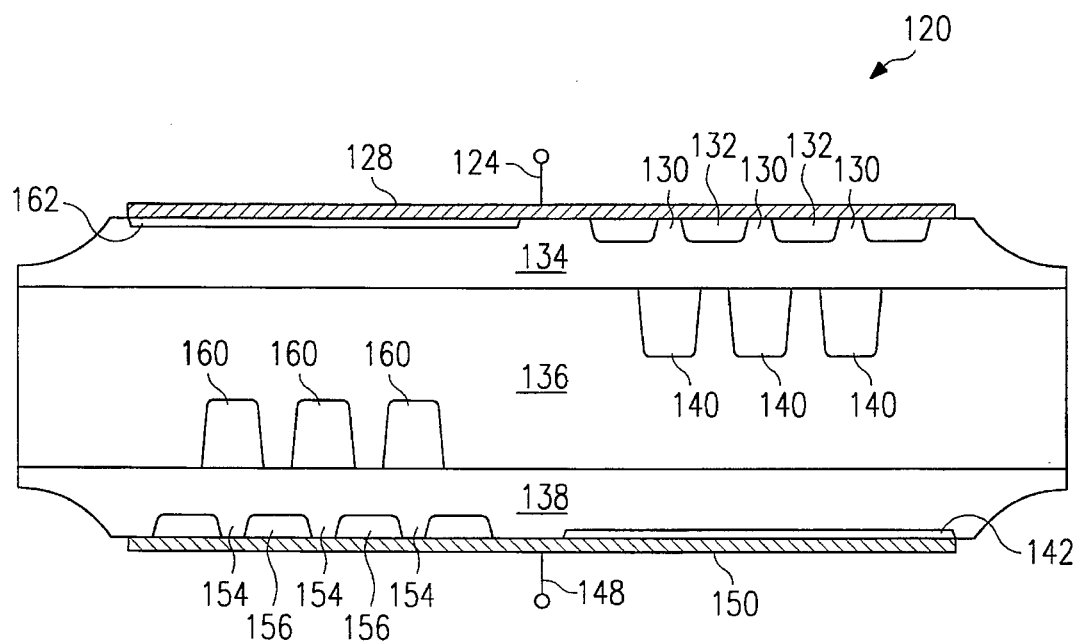
FIG. 5 is a cross sectional view of a bidirectional device possessing two circuit configurations of the present invention disclosed in FIG. 3 in an opposing bidirectional circuit configuration.

FIG. 5 discloses a similar bidirectional circuit configuration 120 as that shown in FIG. 4. The circuit 120 possesses an additional "getter" region 142 for the right hand circuit and 162 for the left hand circuit. The upper metal contact 128 is connected to the upper terminal 124 and the lower metal contact 150 is connected to the lower terminal 148. The upper metal contact 128 is connected to the upper "getter" region 162 while the lower metal contact 150 is contiguous to the lower "getter" region 142.

With respect to the right hand circuit in FIG. 5, the upper base region 134 possesses emitter region 132 and multiple shorting dots 130 contiguous to the upper metal contact 128. As with the embodiment disclosed in FIG. 3, "getter" regions are implanted on top of the shorting dot regions 130 in the emitter region 134. The mid-region layer 136 possesses multiple buried regions 140 with placement of these buried regions substantially aligned with the shorting dot regions 130. The lower base region 138 possesses the lower "getter" region 142 in contact with the lower metal contact 150.

With respect to the left hand circuit shown in FIG. 5, the upper base region 138 possesses emitter region 156 and multiple shorting dots 154. These multiple emitter regions 156 and multiple shorting dot regions 154 are contiguous to the lower metal contact 150. The mid-region layer 136 possesses multiple buried regions 160 substantially aligned with the shorting dot regions 154. The lower base region 134 for the left hand circuit shown in FIG. 5 possesses a "getter" region 162 in contact with the upper metal contact 128. This circuit configuration shown in FIG. 5 allows for bidirectional overvoltage protection including the advantages shown for utilization of a "getter" region, as disclosed in FIG. 3. The type of conductivity is substantially the same as that disclosed in FIG. 3. The protectors disclosed in FIGS. 3–5 all possess the advantages of placing the buried regions substantially aligned with the shorting dot regions. This placement allows for greater surge capacities and lower overshoot than known in the prior art.

The method of making the semiconductor device shown in FIG. 2 is initiated with starting silicon 44 corresponding to the mid-region layer 44. Windows of dopant are implanted in the starting silicon corresponding to the buried regions 42 in the mid-region layer 44. An upper base region layer 40 is then placed above the mid-region layer 44. A lower base region layer 46 is placed underneath the mid-region layer 44 after the upper base region 40 is formed, or at the same time.

The emitter region 39 and shorting dot regions 37 are then placed in the upper base region 40 such that the surface area of the buried region 42 at the upper base/mid-region junction of the device is substantially aligned with the shorting dots in the emitter region. The metal contacts 35 and 48 are then added to complete the device.

An additional "getter" region 78 may be placed in the lower base region of the device shown in FIG. 2, to correspond to the FIG. 3 structure, after the lower base is placed under the mid-region layer. The emitters, shorting dots, and buried regions may be placed on the opposite side of the device to provide a bidirectional device as shown in FIG. 4. That is, reciprocal formations may be made on the bottom surfaces of the device to make the bidirectional device. Further, a "getter" region may be doped into bottom and top of the devices to provide a two sided device as shown in FIG. 5.

Many minor modifications in the structure disclosed in the present application and means for obtaining this structure can be proposed while not departing from the present invention. For example, the dopant concentrations and dopant types of the device may be changed slightly without departing from the present invention. Further, a gate may be connected to the upper base region allowing for triggering of the device much like a triac. Moreover, a getter region may be applied to the upper base region in the shorting dot regions to enhance performance. Further, the dopant types may be reversed if a slight to substantial deficiency in performance can be endured. It is contemplated that the appended claims will cover such modifications as fall within the true spirit and scope of the invention.

We claim:

1. A method of making a multiple layer overvoltage protection device comprising the steps of:

providing a mid-region layer having a first type of conductivity;

forming a plurality of discrete first buried regions having a first type of conductivity in an upper surface of said mid-region layer;

forming an upper base region having a second type of conductivity on the upper surface of said mid-region layer;

forming a lower base region layer having a second type of conductivity on a lower surface of said mid-region layer;

forming a first emitter region having a first type of conductivity on a surface of said upper base region layer;

providing a plurality of discrete first shorting dot regions in said first emitter region wherein at least one of said plurality of discrete first buried regions in said mid-region layer is substantially vertically aligned with at least one of said plurality of discrete first shorting dot regions;

coupling a first metal contact to said upper base region layer; and coupling a second metal contact to said lower base region layer.

2. The method of making a multiple layer overvoltage protection device according to claim 1 wherein substantially vertically aligned includes any amount of coverage of the area under at least one of the plurality of discrete first shorting dot regions by at least one of the plurality of discrete first buried regions.

3. The method of making a multiple layer overvoltage protection device according to claim 1 wherein substantially vertically aligned includes coverage of an entire area under at least one of the plurality of discrete first shorting dot regions by at least one of the plurality of discrete first buried regions.

4. The method of making a multiple layer overvoltage protection device according to claim 1 wherein substantially vertically aligned includes any amount of coverage of the area under at least one of the plurality of discrete first shorting dot regions by at least one of the plurality of discrete first buried regions and any amount of coverage of the area under the first emitter region.

5. The method of making a multiple layer overvoltage protection device according to claim 1 wherein said first type of conductivity is an N-type and said second type of conductivity is a P-type.

6. The method of making a multiple layer overvoltage protection device according to claim 1 wherein said first type of conductivity is a P-type and said second type of conductivity is a N-type.

7. The method of making a multiple layer overvoltage protection device of claim 1 further comprising the steps of:

forming a first getter region having the same type of conductivity as said lower base region in said lower base region.

8. The method of making a multiple layer overvoltage protection device according to claim 7 wherein substantially vertically aligned includes any amount of coverage of the area under at least one of the plurality of discrete first shorting dot regions by at least one of the plurality of discrete first buried regions.

9. The method of making a multiple layer overvoltage protection device according to claim 7 wherein substantially vertically aligned includes coverage of the entire area under at least of one the plurality of discrete first shorting dot regions by at least one of the plurality of discrete first buried regions.

10. The method of making a multiple layer overvoltage protection device according to claim 7 wherein substantially vertically aligned includes any amount of coverage of the area under at least one of the plurality of discrete first shorting dot regions by at least one of the plurality of discrete first buried regions and any amount of coverage of the area under the first emitter region.

11. The method of making a multiple layer overvoltage protection device according to claim 7 wherein said first type of conductivity is an N-type and said second type of conductivity is a P-type.

12. The method of making a multiple layer overvoltage protection device according to claim 7 wherein said first type of conductivity is a P-type and said second type of conductivity is a N-type.

13. The method of making a multiple layer overvoltage device according to claim 1 further comprising the steps of:

forming a second buried region having a first type of conductivity on a surface of said mid-region layer;

forming a second emitter region having a first type of conductivity on a surface of said lower base region layer;

providing a second shorting dot region in said second emitter region wherein said second buried region in said mid-region layer is substantially vertically aligned with said second shorting dot region.

14. The method of making a multiple layer overvoltage protection device according to claim 13 wherein substantially vertically aligned includes any amount of coverage of the area under one of said second shorting dot regions by one of said second buried regions.

15. The method of making a multiple layer overvoltage protection device according to claim 13 wherein substantially vertically aligned includes coverage of the entire area under one of said second shorting dot regions by one of said second buried regions.

16. The method of making a multiple layer overvoltage protection device according to claim 13 wherein substantially vertically aligned includes any amount of coverage of the area under one of said second shorting dot regions by one of said second buried regions and any amount of coverage of the area under one of said emitter regions.

17. The method of making a multiple layer overvoltage protection device according to claim 13 wherein said first type of conductivity is an N-type and said second type of conductivity is a P-type.

18. The method of making a multiple layer overvoltage protection device according to claim 13 wherein said first type of conductivity is a P-type and said second type of conductivity is a N-type.

19. The method of making a multiple layer overvoltage protection device of claim 13 further comprising the steps of:

forming a second getter region having the same type of conductivity as said upper base region in said upper base region.

20. The method of making a multiple layer overvoltage protection device according to claim 19 wherein substantially vertically aligned includes any amount of coverage of the area under one of said second shorting dot regions by one of said second buried regions.

21. The method of making a multiple layer overvoltage protection device according to claim 19 wherein substantially vertically aligned includes coverage of the entire area under one of said second shorting dot regions by one of said second buried regions.

22. The method of making a multiple layer overvoltage protection device according to claim 19 wherein substantially vertically aligned includes any amount of coverage of the area under one of said second shorting dot regions by one of said second buried regions and any amount of coverage of the area under one of said emitter regions.

23. The method of making a multiple layer overvoltage protection device according to claim 19 wherein said first type of conductivity is an N-type and said second type of conductivity is a P-type.

24. The method of making a multiple layer overvoltage protection device according to claim 19 wherein said first type of conductivity is a P-type and said second type of conductivity is a N-type.

25. A method of making a multiple layer overvoltage protection device comprising the steps of:

providing a mid-region layer having a first type of conductivity;

forming a first buried region having a first type of conductivity in an upper surface of said mid-region layer;

forming an upper base region having a second type of conductivity on the upper surface of said mid-region layer;

forming a lower base region layer having a second type of conductivity on a lower surface of said mid-region layer;

forming a first emitter region having a first type of conductivity on a surface of said upper base region layer;

forming a first getter region having the same type of conductivity as said lower base region in said lower base region;

providing a first shorting dot region in said first emitter region;

coupling a first metal contact to said upper base region layer; and coupling a second metal contact to said lower base region layer.

26. The method of making a multiple layer overvoltage protection device according to claim 25 wherein said first type of conductivity is an N-type and said second type of conductivity is a P-type.

27. The method of making a multiple layer overvoltage protection device according to claim 25 wherein said first type of conductivity is a P-type and said second type of conductivity is a N-type.

28. The method of making a multiple layer overvoltage protection device of claim 25 further comprising the steps of:

forming a second getter region having the same type of conductivity as said upper base region in said upper base region.

29. The method of making a multiple layer overvoltage protection device according to claim 28 wherein said first type of conductivity is an N-type and said second type of conductivity is a P-type.

30. The method of making a multiple layer overvoltage protection device according to claim 28 wherein said first type of conductivity is a P-type and said second type of conductivity is a N-type.

31. The method of making a multiple layer overvoltage device according to claim 25 further comprising the steps of:

forming a second buried region having a first type of conductivity on a surface of said mid-region layer opposite said first buried region;

forming a second emitter region having a first type of conductivity on a surface of said lower base region layer opposite said first emitter region;

providing a second shorting dot region in said second emitter region wherein said second buried region in said mid-region layer is substantially aligned with said second shorting dot region.

32. The method of making a multiple layer overvoltage protection device according to claim 31 wherein said first type of conductivity is an N-type and said second type of conductivity is a P-type.

33. The method of making a multiple layer overvoltage protection device according to claim 31 wherein said first type of conductivity is a P-type and said second type of conductivity is a N-type.

* * * * *